United States Patent
Hakuma et al.

(10) Patent No.: US 7,989,256 B2
(45) Date of Patent: Aug. 2, 2011

(54) METHOD FOR MANUFACTURING CIS-BASED THIN FILM SOLAR CELL

(75) Inventors: Hideki Hakuma, Tokyo (JP); Yoshiaki Tanaka, Tokyo (JP); Satoru Kuriyagawa, Tokyo (JP)

(73) Assignee: Showa Shell Sekiyu K.K., Tokyo (JP)

( * ) Notice: Subject to any disclaimer, the term of this patent is extended or adjusted under 35 U.S.C. 154(b) by 0 days.

(21) Appl. No.: 12/671,068

(22) PCT Filed: May 18, 2009

(86) PCT No.: PCT/JP2009/059465
§ 371 (c)(1),
(2), (4) Date: Jan. 28, 2010

(87) PCT Pub. No.: WO2009/142308
PCT Pub. Date: Nov. 26, 2009

(65) Prior Publication Data
US 2010/0210064 A1  Aug. 19, 2010

(30) Foreign Application Priority Data
May 19, 2008  (JP) ................................. 2008-131269

(51) Int. Cl.
*H01L 21/00* (2006.01)
(52) U.S. Cl. ...... 438/95; 438/98; 438/102; 257/E21.068
(58) Field of Classification Search ............... 438/84, 438/98, 102, 95; 257/E21.068; 136/264, 136/265
See application file for complete search history.

(56) References Cited

U.S. PATENT DOCUMENTS

| | | | |
|---|---|---|---|
| 5,626,688 A | 5/1997 | Probst et al. | |
| 5,994,163 A * | 11/1999 | Bodegard et al. | 438/84 |
| 2006/0254462 A1* | 11/2006 | Yano et al. | 106/452 |
| 2009/0130796 A1* | 5/2009 | Taunier et al. | 438/94 |
| 2009/0250722 A1* | 10/2009 | Bruce et al. | 257/184 |
| 2010/0133093 A1* | 6/2010 | MacKie et al. | 204/192.25 |

FOREIGN PATENT DOCUMENTS

| | | |
|---|---|---|
| JP | 8-102546 | 4/1996 |
| JP | 8-222750 | 8/1996 |
| JP | 10-74968 | 3/1998 |
| JP | 2004-140307 | 5/2004 |
| JP | 2007-266626 | 10/2007 |
| JP | 2008-81794 | 4/2008 |

OTHER PUBLICATIONS

International Search Report mailed on Aug. 25, 2009 directed at application No. PCT/JP2009/059465; 1 page. Holz, J. et al. "The Effect of Substrate Impurities on Electronic Conductivity in CIS Thin Films", *Twelfth European Photovoltaic Solar Energy Conference* Apr. 11-15, 1004. Amsterdam, The Netherlands, p. 1592-1595.

\* cited by examiner

*Primary Examiner* — Michael Trinh
(74) *Attorney, Agent, or Firm* — Morrison & Foerster LLP

(57) ABSTRACT

In order to manufacture a CIS-based thin film solar cell that can achieve high photoelectric conversion efficiency by adding an alkali element to a light absorbing layer easily and with good controllability, a backside electrode layer (2) is formed on a substrate (1). Then, a p-type CIS-based light absorbing layer (3) is formed on backside electrode layer (2), and then an n-type transparent and electroconductive film (5) is formed on this p-type CIS-based light absorbing layer (3). At this time, the backside electrode layer (2) is constituted by forming a first electrode layer (21) using a backside electrode material in which an alkali metal is mixed and, then forming a second electrode layer (22) using the backside electrode material that does not substantially contain the alkali metal.

11 Claims, 3 Drawing Sheets

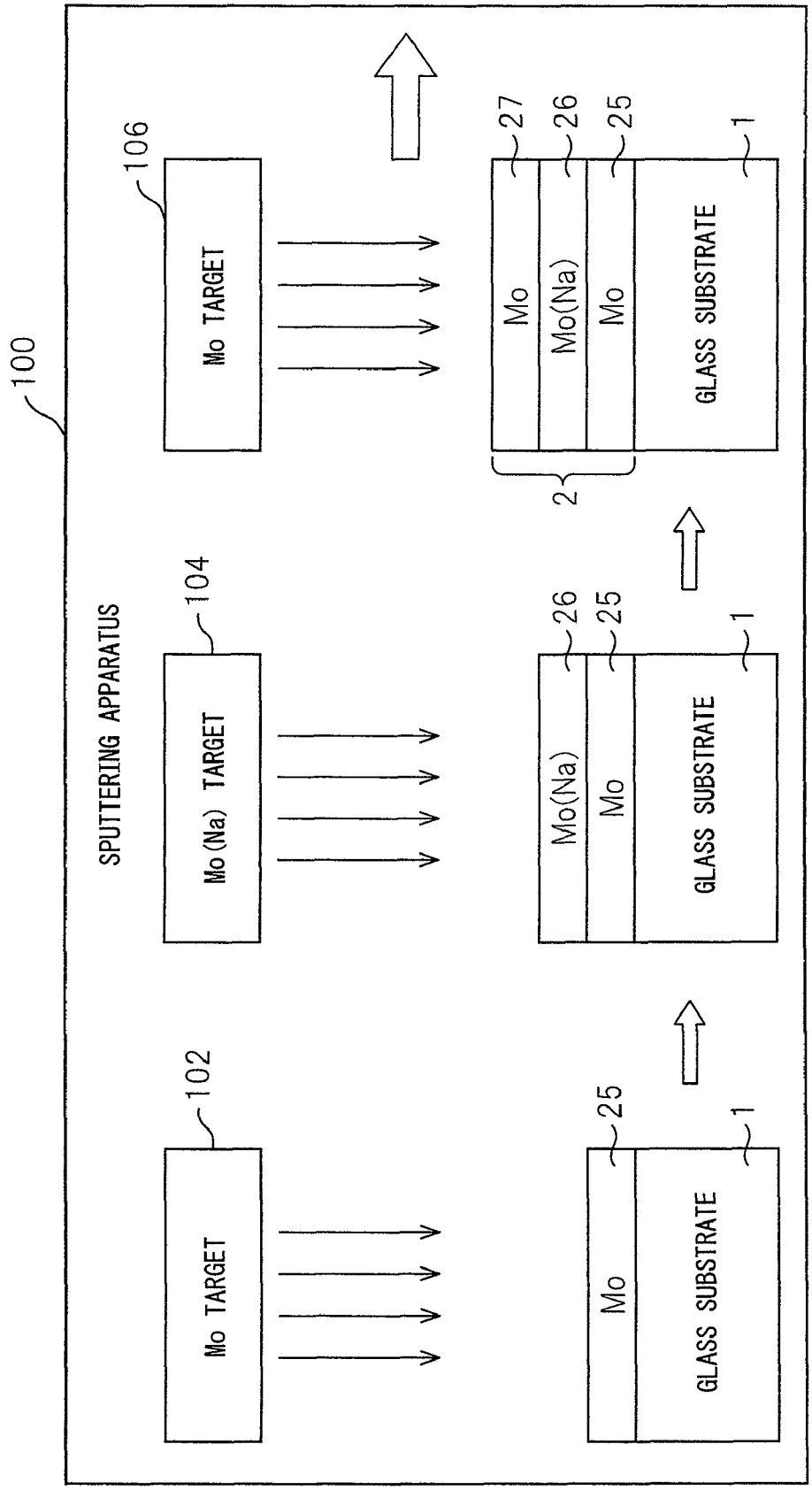

METHOD FOR MANUFACTURING CIS-BASED THIN FILM SOLAR CELL

FIELD

The present invention relates to a method for manufacturing a CIS-based thin film solar cell, and in particular, relates to a method for manufacturing a CIS-based thin film solar cell having high photoelectric conversion efficiency and high reproducibility.

BACKGROUND

In recent years, a CIS-based thin film solar cell that uses a chalcopyrite structure I-III-VI$_2$ group compound semiconductor containing Cu, In, Ga, Se and S as a p-type light absorbing layer has been attracting attention. Since a solar cell of this type can be manufactured at relatively low cost and is expected to achieve high photoelectric conversion efficiency, it is widely considered a leading candidate for a next-generation solar cell. Typical materials include Cu(In, Ga)Se$_2$, Cu(In, Ga)(Se, S)$_2$, CuInS$_2$, etc.

In a CIS-based thin film solar cell, a metal backside electrode layer is formed on a glass substrate. A p-type light absorbing layer comprised of a I-III-VI$_2$ group compound semiconductor is formed on the backside electrode layer, and then a buffer layer and a window layer are formed. In this CIS-based thin film solar cell, it has been reported that high photoelectric conversion efficiency can be achieved when soda lime glass is used as the glass substrate. This is because Na, which is an Ia group element, contained in the soda lime glass is diffused into the p-type light absorbing layer in the formation process of this layer and affects carrier concentration. Therefore, in a CIS-based thin film solar cell, it has been known that controlling of the introduction of Na into the p-type light absorbing layer is an important task that is necessary to improve its photoelectric conversion efficiency.

Controlling the introduction of Na into a p-type light absorbing layer are broadly divided into two categories. The first method of control utilizes the fact that Na contained in a soda lime glass substrate is diffused and absorbed into the p-type light absorbing layer in the formation process of the CIS-based p-type light absorbing layer and controls the amount of diffusion. (See Patent Literature 1.) The second one adds a Na compound from the outside in the formation process of the p-type light absorbing layer. In this case, after inhibiting the diffusion of Na from the glass substrate by providing a blocking layer between the glass substrate and the p-type light absorbing layer, or ensuring that Na is not diffused from the substrate by using the glass substrate not containing Na, the Na compound is added to the p-type light absorbing layer. By doing so, the Na concentration in the p-type light absorbing layer is controlled. (See Patent Documents 2 and 3 and Non-patent Literature 1.)

The first method described above utilizes soda lime glass as the glass substrate. However, soda lime glass has a problem in that it has a relatively low strain point and deforms if the p-type light absorbing layer is formed at a high temperature, for example, at 550° C. or more to improve photoelectric conversion efficiency, and therefore formation temperature cannot be increased. In order to carry out the formation process at such high temperature, a low alkali glass, such as high strain point glass or non-alkali glass has to be used as the glass substrate. However, such glass contains little or no alkali and cannot supply a sufficient amount of alkali to the p-type light absorbing layer.

The second method does not use soda lime glass, and therefore it can solve the problem of the first method described above. However, in this method, it is difficult to add alkali to the p-type light absorbing layer uniformly and with good lot-to-lot reproducibility. It is difficult to handle an alkali metal, such as Na and in order to add an alkali metal to the p-type light absorbing layer, a stable compound, such as NaF, has to be added by spraying or mixed into the Se material. Efficiency of such addition is poor and in the case of NaF, F may adversely affect the formation of the p-type light absorbing layer. Further, when NaF is added to the p-type light absorbing layer by spraying and the like, the diameters of the added particles may not be uniform, and therefore uniform spraying is difficult.

CITATION LIST

Patent Documents

Patent Document 1: Japanese Unexamined Patent Publication No. H10-74968
Patent Document 2: Japanese Unexamined Patent Publication No. H8-222750
Patent Document 3: Japanese Unexamined Patent Publication No. H8-102546

Non-Patent Document

Non-patent Document 1: "The effect of substructure impurities on the electronic conductivity in CIS thin films", 12th European photovoltaic solar energy conference, J. Holz, F. Karg, H. von Philipsborn

SUMMARY OF THE INVENTION

Technical Problem

The present invention has been conceived in order to solve the above problems and it is an object of the present invention to provide a method for manufacturing a CIS-based thin film solar cell that can easily add an alkali element precisely to a p-type light absorbing layer without using soda lime glass, so as to achieve high photoelectric conversion efficiency.

Solution to Problem

In order to solve the above object, in one embodiment of the present invention, there is provided a method for manufacturing a CIS-based thin film solar cell including: forming a backside electrode layer on a substrate; forming a p-type CIS-based light absorbing layer on the backside electrode layer; and forming an n-type transparent and electroconductive film on the p-type CIS-based light absorbing layer, wherein the forming the backside electrode layer includes: forming a first electrode layer using a backside electrode material in which an alkali metal is mixed; and forming a second electrode layer using the backside electrode material that does not substantially contain the alkali metal.

In the method, the first electrode layer and the second electrode layer may be formed by sputtering, evaporation or ion plating.

Further, the substrate may be formed of high strain point glass, non-alkali glass, metal or resin.

Still further, the backside electrode material may be Mo, Ti or Cr.

Still further, the alkali metal may be Na, K or Li.

Still further, when the backside electrode material is Mo and the alkali metal is Na, the first electrode layer may be formed using Mo containing at least 0.3% of Na (ratio of the number of atoms, at. %) as a target or an evaporation source.

Still further, when the backside electrode material is Mo and the alkali metal is Na, the second electrode layer may be formed using Mo containing 0.01 at. % or less of Na as a target or an evaporation source.

Still further, the p-type light absorbing layer may be formed by selenization/sulfurization or multi-source coevaporation.

Still further, the method may include forming an n-type high resistance buffer layer between the forming the p-type light absorbing layer and the forming the n-type transparent and electroconductive film.

ADVANTAGEOUS EFFECTS OF THE INVENTION

In the method of the present invention, the backside electrode layer formed on the substrate contains the alkali element and when the p-type light absorbing layer is formed, this alkali element is diffused and absorbed into the p-type light absorbing layer. As a result, there is no need to use soda lime glass containing the alkali element as the substrate for forming the solar cell and a substrate that can withstand high temperature heating can be used to increase the temperature when the p-type light absorbing layer is formed. Further, because the alkali element is added to the electrode material in the form of metal, efficiency of the addition is improved. Still further, because the backside electrode layer is formed by sputtering, evaporation, ion plating, etc, the alkali metal can be added to the electrode layer uniformly and moreover, with good lot-to-lot reproducibility. As a result, a CIS-based thin film solar cell of high quality can be manufactured at low cost.

BRIEF DESCRIPTION OF THE DRAWINGS

FIG. 3 is a diagram describing a process for forming a metal backside electrode layer according to an embodiment of the present invention.

DESCRIPTION OF THE EMBODIMENTS

Figure 1:
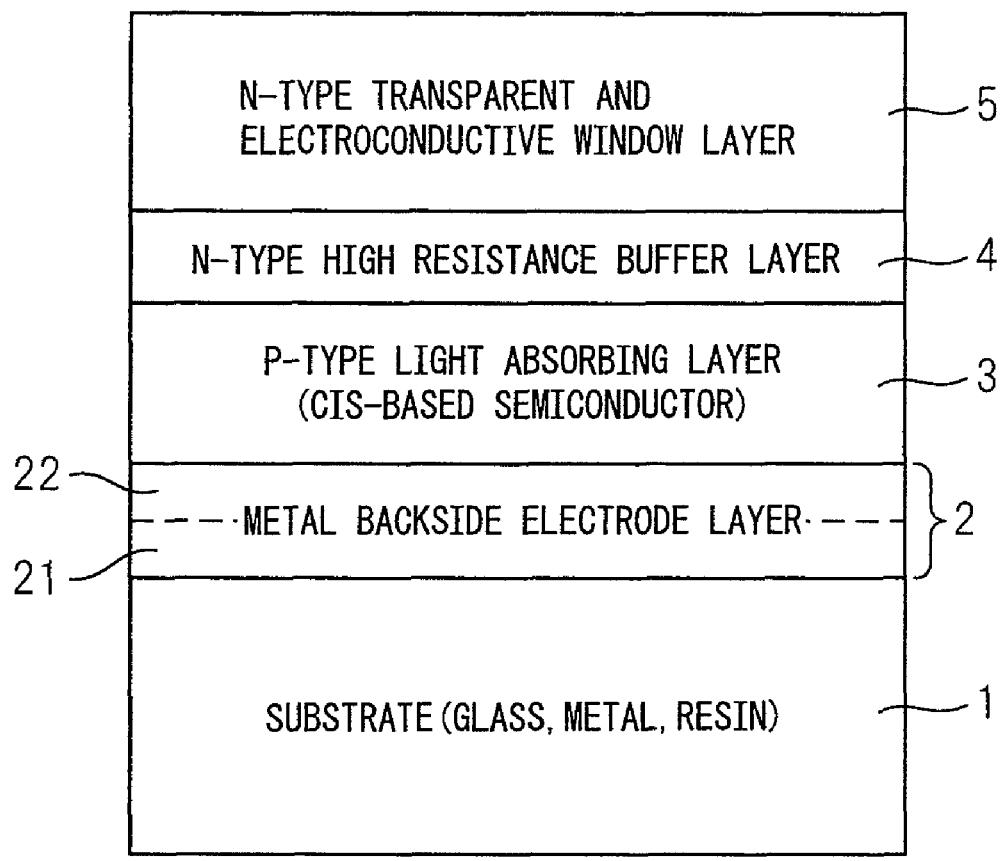
FIG. 1 is a schematic cross-sectional view of a CIS-based thin film solar cell that is manufactured by a method according to an embodiment of the present invention.

FIG. 1 is a schematic cross-sectional view illustrating a structure of a CIS-based thin film solar cell according to an embodiment of the present invention. In this figure, a glass substrate 1 is comprised of low alkali glass, such as high strain point glass or non-alkali glass. Because such glass substrate has a strain point of 50° C. or higher than that of conventional soda lime glass, in a process for forming a p-type light absorbing layer, process temperature can be increased and, as a result, a high-quality p-type light absorbing layer can be formed. Substrate 1 may be comprised of materials other than glass, such as stainless steel, other metals, polyimide resin, etc.

In FIG. 1, a metal backside electrode layer 2 is illustrated. Metal backside electrode layer 2 has a thickness of 0.2-2 μm and it is formed of high corrosion resistant and high melting point metals such as molybdenum (Mo), titanium (Ti), chromium (Cr) or the like. Layer 2 is deposited on substrate 1 by DC sputtering using these metals as a target. Layer 2 is formed in at least two stages comprising a first stage in which the DC sputtering is performed adding an alkali metal such as Na to the target material such as Mo, for example, and a second stage in which only the electrode material is DC sputtered. FIG. 1 illustrates a layer 21 that is formed using the Mo target containing Na and a layer 22 that is formed using the Mo target not containing Na. The process for forming metal backside electrode layer 2 including these layers 21 and 22 will be described later with reference to FIGS. 2A-2C and 3.

In FIG. 1, a p-type CIS-based light absorbing layer (hereinafter referred to as the "p-type light absorbing layer") 3 is a I-III-VI$_2$ group chalcopyrite structure thin film of 1 - 3 μm thickness and a multinary compound semiconductor thin film such as, for example, CuInSe$_2$, Cu(InGa)Se$_2$, Cu(InGa)(SSe)$_2$ is used for this layer. P-type light absorbing layer 3 is typically formed by selenization/sulfurization or multi-source coevaporation. Either of them may be used in the CIS-based thin film solar cell of this embodiment. In the selenization/sulfurization, a metal precursor film of laminated or mixed-crystal structure containing copper (Cu), indium (In) and gallium (Ga) (Cu/In, Cu/Ga, Cu-Ga alloy/In, Cu-Ga-In alloy and the like) is deposited on metal backside electrode layer 2 by sputtering or evaporation and, then, heat treatment is performed at about 400° C. or more in selenium and/or sulfur-containing atmosphere, so that selenized/sulfurized p-type light absorbing layer 3 can be formed.

In the multi-source coevaporation, a material containing Cu, In, Ga and Se in an appropriate combination is deposited on glass substrate 1 that has metal backside electrode layer 2 and that is heated to about 500° C. or more, so that p-type light absorbing layer 3 can be formed.

In FIG. 1, an n-type high resistance buffer layer (hereinafter referred to as the "buffer layer") 4 is formed on p-type light absorbing layer 3. Buffer layer 4 is an ultra thin film of 10-50 nm film thickness that has n-type conductivity and wide band gap and that is transparent and high resistant. Buffer layer 4 is comprised of a compound containing Cd, Zn and In, such as, typically, CdS, ZnO, ZnS, Zn(OH)$_2$, In$_2$O$_3$, In$_2$S$_3$, or their mixed crystal Zn(O, S, OH). Buffer layer 4 is typically deposited by chemical bath deposition (CBD) but it may be formed by a dry process such as metal organic chemical evaporation (MOCVD) and atomic layer deposition (ALD). In the CBD process, the substrate is immersed in a solution containing chemical species acting as precursors to cause heterogeneous reaction between the solution and the substrate surface, so that the thin film can be deposited on the substrate.

In FIG. 1, an n-type transparent and electroconductive window layer (hereinafter referred to as the "window layer") 5 is a transparent and electroconductive film of 0.05-2.5 μm film thickness that has n-type conductivity and wide band gap and that is transparent and has low resistivity. Window layer 5 is typically comprised of a zinc oxide (ZnO) based thin film or an ITO thin film. In the case of the ZnO thin film, it is made low resistant by adding a III group element (for example, Al, Ga and B) as a dopant. Window layer 5 is formed by sputtering (DC, RF), MOCVD and the like.

Figure 2A:
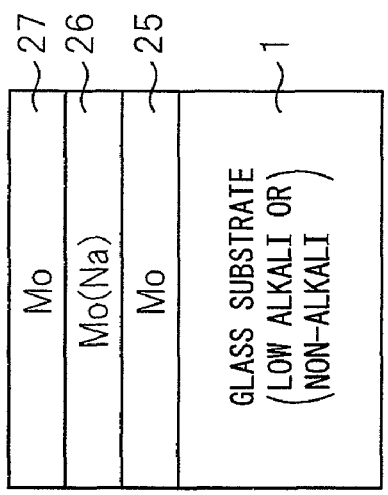
FIGS. 2A-2C are schematic cross-sectional views for describing structures of a metal backside electrode layer according to various embodiments of the present invention.
Figure 2B:
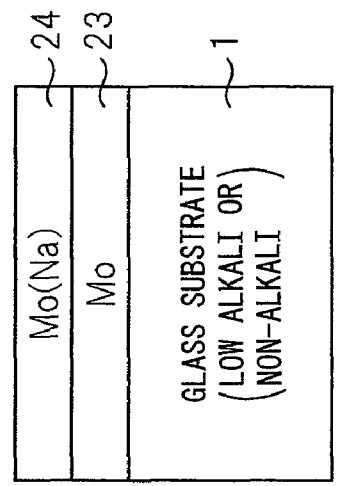
Figure 2C:
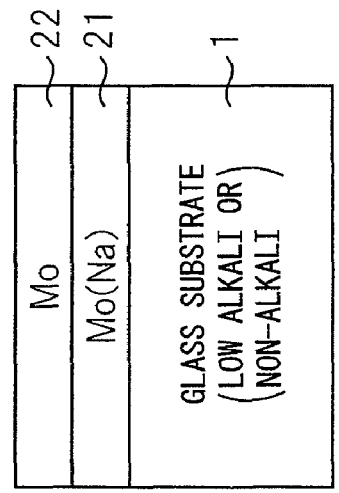

FIGS. 2A-2C are schematic cross-sectional views illustrating various structures of metal backside electrode layer 2 illustrated in FIG. 1. Though cases in which Mo is used as the metal that forms metal backside electrode layer 2 and Na is used as the alkali metal that is added to metal backside electrode layer 2 are described in the following embodiments; however the present invention is not limited to these materials. For example, Ti, Cr and the like may be used for the metal backside electrode in place of No and K, Li and the like may be used as the added alkali metal in place of Na.

In the embodiment illustrated in FIG. 2A, Mo with the addition of Na is used as the target material to form layer 21 of Mo containing Na on glass substrate 1 by sputtering, for example, and then Mo without the addition of Na is used as the target material to form layer 22 of Mo not containing Na. The "Mo target without the addition of Na" means that the Mo target that does not substantially contain Na but, in reality, it contains Na of very low concentration such as, for example, 1-100 at ppm. However, such low concentration of Na affects the p-type light absorbing layer very little, and therefore it is mentioned as "layer 22 of Mo not containing Na" in this patent specification.

In the embodiment illustrated in FIG. 2B, first, a No layer 23 not containing Na is formed on glass substrate 1 and then a Mo layer 24 containing Na is formed. In the embodiment illustrated in FIG. 2C, first, a Mo layer 25 not containing Na is formed on glass substrate 1 and then a Mo layer 26 containing Na is formed and further a No layer 27 not containing Na is formed. Though metal backside electrode layer 2 is illustrated as two or three layer structure in FIGS. 2A-2C, metal backside electrode layer 2 may be comprised of more than three layers. It is important that metal backside electrode layer 2 be formed of at least two layers one of which contains the alkali metal and the other of which does not contain the alkali metal. Further, the order of the lamination is not particularly limited.

FIG. 3 is a diagram describing a process for manufacturing the electrode structure illustrated in FIG. 2C. In the figure, there is illustrated a sputtering apparatus 100 in which a plurality of targets 102, 104 and 106 are provided. Sputtering apparatus 100 is configured so that glass substrate 1 is sequentially moved to positions of each target. First, glass substrate 1 is sputtered with Mo under target 102 so that Mo layer 25 is formed on glass substrate 1. Next, glass substrate 1 is transferred to the position under target 104 and sputtered with Mo containing Na so that Mo (Na) layer 26 is formed on Mo layer 25. After that, glass substrate 1 is transferred to the position under target 106 and sputtered with Mo so that Mo layer 27 is formed on Mo (Na) layer 26.

After metal backside electrode 2 of three-layer structure is formed on glass substrate 1 as described above, p-type light absorbing layer 3 is formed on electrode 2, though not illustrated. P-type light absorbing layer 3 may be formed in the same sputtering apparatus 100 or in the other sputtering apparatus. Further, it may be formed using the selenization/sulfurization or the multi-source coevaporation. The formation of p-type light absorbing layer 3 using these processes is publicly known and it is not described in detail here.

Though sputtering is used for forming metal backside electrode 2 in FIG. 3, the present invention is not limited to sputtering, evaporation or ion plating. Also in such cases, both Mo to which Na is added and Mo to which Na is not positively added are used as the target or evaporation source to form metal backside electrode 2 in multi-stages.

As described above, because the addition of Na to metal backside electrode layer 2 is performed using No with the addition of metallic Na as the target, in comparison with the case in which Na is added as a compound such as NaF, efficiency of the addition is improved and further because metal backside electrode layer 2 does not contain elements other than Na, absorbed elements other than Na do not adversely affect the p-type light absorbing layer. Further, because the electrode layer is formed by sputtering, evaporation or ion plating, an electrode layer that uniformly contains the alkali metal of a desired concentration can be easily formed.

Still further, because the sputtering, evaporation or ion plating is performed in at least two stages with the combination of the Mo target that contains a certain amount of Na and the Mo target that does not substantially contain Na, the amount of Na added to electrode layer 2 can be freely controlled.

In the heat treatment when p-type light absorbing layer 3 is formed on metal backside electrode layer 2, the alkali element in No (Na) layers 21, 24 and 26 illustrated in FIGS. 2A-2C is diffused into p-type light absorbing layer 3 to increase carrier concentration in p-type light absorbing layer 3 and as a result improve its photoelectric conversion efficiency. Therefore, after completion of the manufacturing process of the CIS-based thin film solar cell, metal backside electrode layer 2 is not clearly divided into the layer containing the alkali metal and the layer not containing it as illustrated in these figures.

Hereinafter, Experimental Examples 1 and 2 in which the CIS-based thin film solar cell is manufactured according to the method of the present invention, as well as the effects of the present invention will be described. Both experimental examples were formed as stated in Table 1.

TABLE 1

| Process conditions | |
| --- | --- |
| Glass substrate 1 | High strain point glass (PD200, manufactured by Asahi Glass Co., Ltd.) |
| Metal backside electrode layer 2 | Formed by sputtering of Mo. Film thickness - 0.5 μm. Na Concentration is stated separately. |
| P-type light absorbing layer 3 | After forming a metal precursor film, selenization/sulfurization is performed to form Cu(InGa)(SSe)$_2$. Film thickness - 1.5 μm Cu/III = 0.9, Ga/III = 0.3 Selenization = 400° C. × 30 min., volume concentration of H$_2$Se - 5% sulfurization = 550° C. × 30 min., volume concentration of H$_2$S - 15% |
| N-type high resistance buffer layer 4 | CBD method Zn (O, S, OH) Film thickness - 30 nm |
| N-type transparent and electroconductive window layer | MOCVD method ZnO:B Film thickness - 1.3 μm |

Further, when metal backside electrode layer 2 is formed, the concentration of Na in the Mo target is stated in Table 2.

TABLE 2

| Na concentration in Mo target | |
| --- | --- |
| High Na target | 0.1 at. %, 0.3 at. %, 1 at. %, 3 at. % |
| Low Na target (without Na) | 1 at.ppm, 10 at.ppm, 100 at.ppm |

Experimental Example 1

After forming a metal backside electrode on glass substrate 1 in the order of Mo layer 21 with high Na concentration and Mo layer 22 with low Na concentration, p-type light absorbing layer 3, n-type high resistance buffer layer 4 and n-type transparent and electroconductive window layer 5 were formed according to the process conditions of Table 1. On conditions that Na concentration in the low Na target was fixed to 10 at ppm and Na concentration in the high Na target was set to the four levels stated in Table 2, film thicknesses of Mo layer 21 with high Na concentration and Mo layer 22 with low Na concentration were changed. The experimental results of this case are illustrated in Table 3.

TABLE 3

Experimental results 1

| High Na concentration [at. %] | Low Na film thickness [μm] | High Na film thickness [μm] | Conversion efficiency [%] | Average Na concentration in CIS [at. %] |
|---|---|---|---|---|
| 0.1 | 0 | 0.5 | 13.7 | 0.06 |
| 0.1 | 0.1 | 0.4 | 12.8 | 0.04 |
| 0.1 | 0.2 | 0.3 | 11.8 | 0.02 |
| 0.1 | 0.3 | 0.2 | 9.7 | 0.01 |
| 0.1 | 0.4 | 0.1 | 6.1 | 0.01 |
| 0.3 | 0 | 0.5 | 15.0 | 0.18 |
| 0.3 | 0.1 | 0.4 | 15.9 | 0.12 |
| 0.3 | 0.2 | 0.3 | 14.5 | 0.07 |
| 0.3 | 0.3 | 0.2 | 12.1 | 0.03 |
| 0.3 | 0.4 | 0.1 | 7.9 | 0.01 |
| 1 | 0 | 0.5 | 11.6 | 0.68 |
| 1 | 0.1 | 0.4 | 14.5 | 0.38 |
| 1 | 0.2 | 0.3 | 16.1 | 0.24 |
| 1 | 0.3 | 0.2 | 15.2 | 0.10 |
| 1 | 0.4 | 0.1 | 10.7 | 0.03 |
| 3 | 0 | 0.5 | detachment | — |
| 3 | 0.1 | 0.4 | 2.7 | 1.05 |
| 3 | 0.2 | 0.3 | 10.1 | 0.71 |
| 3 | 0.3 | 0.2 | 15.2 | 0.28 |
| 3 | 0.4 | 0.1 | 14.5 | 0.08 |
| — | 0.5 | 0 | 4.6 | 0.00 |

As apparent from Table 3, when metal backside electrode layer 2 was formed of Mo, the CIS-based thin film solar cell having high photoelectric conversion efficiency of 14% or more could be obtained by controlling the Na concentration in the Mo target. On the other hand, high photoelectric conversion efficiency could be obtained in some conditions even though only Mo layer 21 with high Na concentration was formed and Mo layer 22 with low Na concentration was not formed (cases in which Na concentration in the high Na concentration target was 0.3 at. %). However, in these cases, it is technically difficult to control the amount of Na in the target with good lot-to-lot reproducibility and as a result product yields are reduced and manufacturing cost increases. Therefore, it is preferable that the metal backside electrode layer is formed of at least two layers including the Mo layer with high Na concentration and the Mo layer with low Na concentration (without Na). Further, from the photoelectric conversion efficiency column in Table 3, it is found that the desired Na concentration in the Mo target with high Na concentration is 0.3 at. % or more.

Experimental Example 2

After forming metal backside electrode 2 in the order of Mo layer 21 with high Na concentration and Mo layer 22 with low Na concentration, p-type light absorbing layer 3, n-type high resistance buffer layer 4 and n-type transparent and electroconductive window layer 5 were formed according to the process conditions of Table 1. Then, photoelectric conversion efficiency of a resultant CIS-based thin film solar cell was measured. In this case, on conditions that Na concentration in the low Na target was set to the three levels stated in Table 2 and the Na concentration in the high Na concentration target was fixed to 1 at. %, film thicknesses of Mo layer 21 with high Na concentration and Mo layer 22 with low Na concentration were changed. The experimental results of this case are illustrated in Table 4.

TABLE 4

Experimental results 2

| Low Na concentration [at. ppm] | Low Na film thickness [μm] | High Na film thickness [μm] | Conversion efficiency [%] | Average Na concentration in CIS [at. %] |
|---|---|---|---|---|
| 1 | 0 | 0.5 | 11.6 | 0.68 |
| 1 | 0.1 | 0.4 | 15.0 | 0.36 |
| 1 | 0.2 | 0.3 | 15.9 | 0.23 |
| 1 | 0.3 | 0.2 | 14.8 | 0.09 |
| 1 | 0.4 | 0.1 | 10.5 | 0.03 |
| 10 | 0.1 | 0.4 | 14.5 | 0.38 |
| 10 | 0.2 | 0.3 | 16.1 | 0.24 |
| 10 | 0.3 | 0.2 | 15.2 | 0.10 |
| 10 | 0.4 | 0.1 | 10.7 | 0.03 |
| 100 | 0.1 | 0.4 | 14.3 | 0.39 |
| 100 | 0.2 | 0.3 | 15.7 | 0.26 |
| 100 | 0.3 | 0.2 | 15.4 | 0.11 |
| 100 | 0.4 | 0.1 | 11.1 | 0.04 |
| — | 0.5 | 0 | 4.6 | 0.00 |

As apparent from Table 4, the CIS based thin film solar cell having high photoelectric conversion efficiency of 14% or more can be formed by controlling the film thicknesses of the Mo layer with low Na concentration and the Mo layer with high concentration. The Na concentration in the Mo target with low Na concentration is constant at 1-100 at ppm (0.01 at. %). Therefore, the Na concentration in the target with low Na concentration should be 100 at ppm or less.

REFERENCE NUMERALS

1 Non-alkali or low alkali glass substrate
2 Metal backside electrode layer
3 P-type light absorbing layer
4 N-type high resistance buffer layer
5 N-type transparent and electroconductive window layer
21, 24, 26 Mo layer containing Na
22, 23, 25, 27 Mo layer
100 Sputtering apparatus
102 Mo target
104 Mo target containing Na
106 Mo target

What is claimed is:
1. A method for manufacturing a CIS-based thin film solar cell comprising:
   forming a backside electrode layer on a substrate;
   forming a p-type CIS-based light absorbing layer on said backside electrode layer; and
   forming an n-type transparent and electroconductive film on said p-type CIS-based light absorbing layer,
   wherein said forming of said backside electrode layer comprises forming a first electrode layer using a first target or a first evaporation source that comprises a backside electrode material and an alkali metal and forming a second electrode layer using a second target or a second evaporation source that comprises said backside electrode material but does not substantially contain an alkali metal.
2. A method for manufacturing a CIS-based thin film solar cell according to claim 1, wherein said substrate is formed of any of high strain point glass, non-alkali glass, metal and resin.

3. A method for manufacturing a CIS-based thin film solar cell according to claim 2, wherein said backside electrode material is Mo and said alkali metal is Na.

4. A method for manufacturing a CIS-based thin film solar cell according to claim 3, wherein said first electrode layer is formed using Mo containing at least 0.3 at % of Na as a target or an evaporation source.

5. A method for manufacturing a CIS-based thin film solar cell according to claim 3, wherein said second electrode layer is formed using Mo containing 0.01 at.% or less of Na as a target or an evaporation source.

6. A method for manufacturing a CIS-based thin film solar cell according to claim 4, wherein said second electrode layer is formed using Mo containing 0.01 at. % or less of Na as a target or an evaporation source.

7. A method for manufacturing a CIS-based thin film solar cell according to claim 1, wherein said first electrode layer and said second electrode layer are formed by any of sputtering, evaporation and ion plating.

8. A method for manufacturing a CIS-based thin film solar cell according to claim 1, wherein said backside electrode material is any of Mo, Ti and Cr.

9. A method for manufacturing a CIS-based thin film solar cell according to claim 1, wherein said alkali metal is any of Na, K and Li.

10. A method for manufacturing a CIS-based thin film solar cell according to claim 1, wherein said p-type light absorbing layer is formed by selenization/sulfurization or multi-source coevaporation.

11. A method for manufacturing a CIS-based thin film solar cell according to claim 1, further comprising forming an n-type high resistance buffer layer between said forming said p-type light absorbing layer and said forming said n-type transparent and electroconductive film.

* * * * *